_United States Patent_ [19] [11] Patent Number: 4,542,949
Tewes et al. [45] Date of Patent: Sep. 24, 1985

[54] CIRCUIT CARRIER CONNECTOR

[75] Inventors: Udo Tewes; Rolf Roeschlein, both of Paderborn, Fed. Rep. of Germany

[73] Assignee: Nixdorf Computer AG, Fed. Rep. of Germany

[21] Appl. No.: 569,791

[22] Filed: Jan. 11, 1984

[30] Foreign Application Priority Data

Jan. 11, 1983 [DE] Fed. Rep. of Germany ....... 3300706

[51] Int. Cl.[4] .............................................. H01R 9/09
[52] U.S. Cl. .............................. 339/75 M; 339/17 CF
[58] Field of Search .......... 339/17 CF, 75 M, 75 MP, 339/176 M, 176 MP, 186 R, 186 M

[56]  References Cited

U.S. PATENT DOCUMENTS 4,354,718 10/1982 Bright et al. ................. 339/17 CF
4,378,139  3/1983 Griffin et al. ................. 339/75 MP
4,406,508  9/1983 Sadigh-Behzadi ............. 339/17 CF
4,412,714 11/1983 Morningstar et al. ........... 339/91 R
4,470,650  9/1984 Lundergan .................... 339/75 MP

FOREIGN PATENT DOCUMENTS 2532885 12/1976 Fed. Rep. of Germany ... 339/186 R

OTHER PUBLICATIONS

"Interconnection Packaging Devices and Accessories", AMP, 1974, No. 14, pp. 120-121.

_Primary Examiner_—John McQuade
_Attorney, Agent, or Firm_—Krass & Young

[57] ABSTRACT

Apparatus for the plug-in assembling of a circuit provided with contact feet, especially an integrated circuit carrier onto an appliance provided with receptacles, or the like. The circuit carrier is inserted in a protective cover and together with this is placed on a base previously mounted in the receptacles of the appliance. Thereby the contact feed come into connection with the circuit of the appliance by way of contact elements arranged on the base. In order to fulfill certain requirements for a reliable large-area or multiple contact by the contact element, it is provided that the circuit carrier is placed on an intermediate contact carrier which carries a plurality of contact plates connected with the contact feet of the circuit carrier respectively by means of soldered junctions, which plates in turn show the desired contact properties.

16 Claims, 9 Drawing Figures

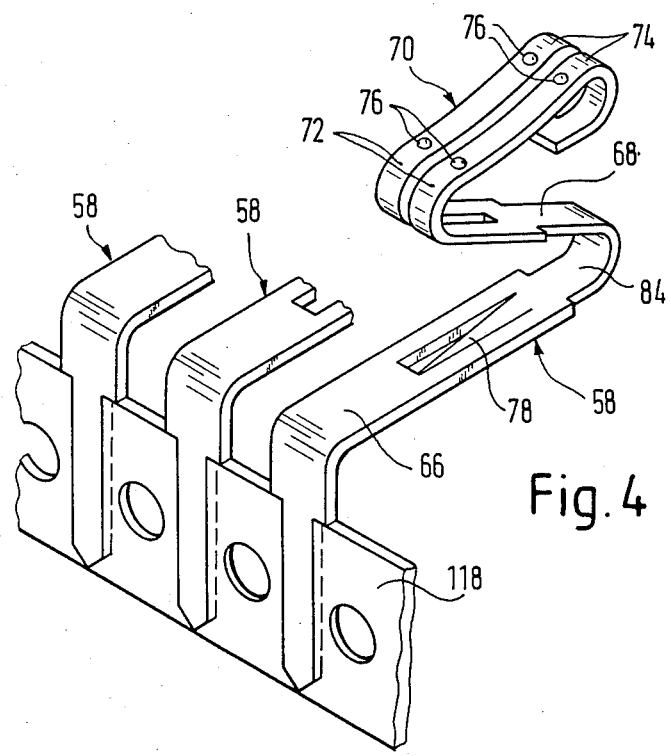
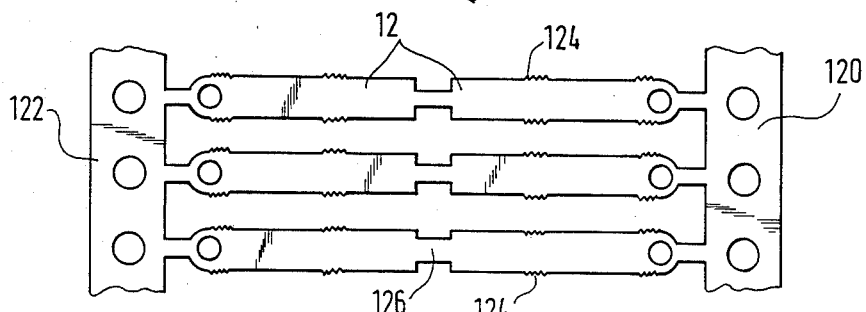
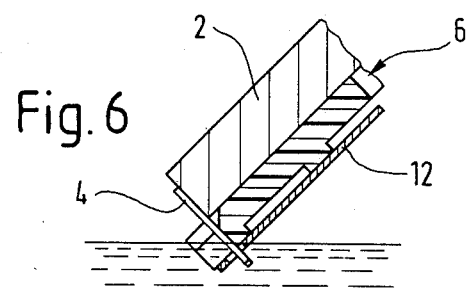

CIRCUIT CARRIER CONNECTOR

FIELD OF THE INVENTION

The invention relates to an apparatus for the plug-assembly of integrated circuits with receptacles and to a process for fabricating and assembling individual components of the apparatus.

BACKGROUND OF THE INVENTION

Electrical circuit carriers with small dimensions, especially integrated circuit (IC) components are generally assembled or cast by the manufacturer by reason of their sensitive structure and their small dimensions; the fine, sensitive connective wires are joined with contact feet formed on the circuit carrier. They come on the market in this form, in which for example the sensitive IC components themselves are no longer accessible from the outside. The shapes of the circuits, especially their dimensions, the number and spacing distance of their contact feet, etc., are largely standardized.

The circuit carrier can then be plugged into receptacles formed on the electrical appliance which are arranged in contact feet, where it comes into connection with the elements of an electrical circuit with which it is to interact. The contact feet are generally soldered with the connecting piece.

In order to make easier this very laborious assembling, which by reason of the soldering heat formed is especially disadvantageous for the IC components, the principle has already been known of first placing a base on the electrical appliance, which base is provided with contact elements corresponding to the contact feet of the circuit carrier so that it fits in the receptacles of the appliance. Since the base does not carry any sensitive electronic components, it can be soldered without danger to the connecting piece. An IC carrier for example is placed on this base, whereby these contact feet come into connection with the contact elements of the base. In order to protect the IC carrier as well as to hold the latter fast onto the base, a cover is provided which can be clapped on over the IC carrier (AMP prospectus, "Interconnection Packaging Devices and Accessories", 1974, No. 14, pages 120 and 121).

In the known solution the assembling and particularly the assembling by hand of the whole apparatus is very complicated and involves uncertainties as regards the correct arrangement of the IC carrier. The IC carriers in general are constructed symmetrically with respect to a longitudinal axis. Therefore they can basically be used in two positions rotated by 180° in receptacles formed in the electrical appliance. The correct position can be recognized only from a marking or the like arranged on the IC carrier. Likewise, in the known solution the IC carriers can be placed on the base in two different positions rotated by 180°, when special coding means are not arranged both on the base and on the IC carrier, which permit only one mounting position of the IC carrier on the base. However such coding means are not provided on the standardized IC carriers.

For assembling the apparatus, the IC carrier is first placed on the base which has previously been connected with the electrical appliance, wherewith the correct position of the IC carrier is not ensured, especially when the mounting places are not easily accessible or visible. The IC carrier must then be pressed onto the flexible contact elements of the base and secured on these, while the cover is being clapped on over the IC carrier and placed on the base, which requires quite a special aptitude on the workers especially when the mounting places are not very accessible.

SUMMARY OF THE INVENTION

It is the problem of the present invention to create an apparatus of the type of this class which permits a substantially simpler assembly than the known solution and in which any erroneous mounting of the apparatus on the base can be excluded with no special coding of the circuit carrier.

This problem is solved according to the invention by an apparatus including a cover into which the circuit carrier is placed in a fixed and predetermined position, which cover and carrier, as a subassembly, are then inserted into a base receptacle.

More specifically, the circuit carrier, before being mounted, is placed in the cover and fixed in a predetermined position. The correct insertion of the circuit carrier in the cover can be done without difficulties, for example at special mounting work places. The subassembly group consisting of cover and circuit carrier is then placed on the base. Therewith the correct position of the cover with respect to the base can be ensured by the use of the coding means formed on this, so that, without altering the circuit carrier, this too can receive its correct position relative to the base by the application of coding means. In contrast to the known construction, the structural group consisting of cover and circuit carrier can be mounted in a simple manner, e.g., with one hand, on the base, so that an appreciably easier mounting as well as an absolute security against erroneous mounting result especially with inaccessible and difficult visible mounting places.

In the known apparatus the contact elements of the base are formed as individual tongues introduced through openings in the base, where the part of the tongues located on the bottom of the base can be plugged respectively into assigned receptacles in the electrical appliance and the part located on the top side of the base comes in contact with the contact feet of the IC carrier put in place. In particular, the part of the tongues arranged on the top side of the base lies largely unprotected and without adequate guiding next to one another, so that when the IC carrier is inexpertly put in place there is the danger that this will be bent and come into connection with adjacent contact elements or with unassigned contact feet of the IC carrier. Therefore according to one feature of the invention it is provided that the circuit carrier can be placed on an intermediate contact carrier and can be fastened onto this, wherewith the contact feet of the circuit carrier respectively come into connection with the contact plates or the like fixedly arranged on the intermediate contact carrier. The intermediate contact carrier can in turn be joined without particular difficulty, e.g. at certain mounting places, with the circuit carrier and be inserted into the cover together with this. The contact plates of the intermediate contact carrier may be ideally shaped and mounted on the intermediate contact carrier in such a way that the danger of damage or of making erroneous contact connections when the structural group formed by the cover, the circuit carrier and the intermediate contact carrier is placed on the base can be excluded, as will be described more accurately.

For the circuit carriers usually used, with contact feet aligned in the plug-in direction it is provided according to the invention that onto the underside of the circuit carrier in the plug-in direction an intermediate contact carrier can be fastened with contact plates lying on its underside and projecting out over its side edges, where the contact feet of the circuit carrier which overlap these side edges respectively come into electrically conducting contact with assigned contact plates. The contact plates may be constructed considerably better than the contact feet of the circuit carrier for a large-area contact or a contact in a plurality of contact points with the contact elements of the base. In order to fulfill the condition than an electrical contact occurs respectively only once between the contact feet of the circuit carrier and the receptacles of the electrical appliance in the whole structure of the apparatus according to the invention, a soldered junction can be provided between the contact feet and the contact plates. When the subassembly group made up of the cover, the circuit carrier and the intermediate contact carrier is placed on the base, the contact plates of the intermediate contact carrier come into electrically conductive contact with the assigned contact elements run on the upper side of the base.

For the circuit carriers usually used, with contact feet aligned in the plug-in direction it is provided according to the invention that onto the underside of the circuit carrier in the plug-in direction an intermediate contact carrier can be fastened with contact plates lying on its underside and projecting out over its side edges, where the contact feet of the circuit carrier which overlap these side edges respectively come into electrically conducting contact with assigned contact plates. The contact plates may be constructed considerably better than the contact feet of the circuit carrier for a large-area contact or a contact in a plurality of contact points with the contact elements of the base. In order to fulfill the condition that an electrical contact occurs respectively only once between the contact feet of the circuit carrier and the receptacles of the electrical appliance in the whole structure of the apparatus according to the invention, a soldered junction can be provided between the contact feet and the contact plates. When the subassembly group made up of the cover, the circuit carrier and the intermediate contact carrier is placed on the base, the contact plates of the intermediate contact carrier come into electrically conductive contact with the assigned contact elements run on the upper side of the base.

According to one feature of the invention the cover on its upper side shows a cooling opening in which at least one outward swingable swinging flap is arranged in the manner of a door leaf and can be swung between a closed position partly covering this opening over and an opening position unblocking the opening. The covering over is extensive enough that on the one hand the circuit carrier arranged under it is protected against damage and that on the other hand, however, cooling air can circulate in connection with other openings provided in the cover. In its open position the swinging flap can serve as a handle for handling the submodule.

In a further development of the invention two swinging flaps can be provided next to one another which are pivoted on their adjacent side edges, where in their open position lying flat on one another they project out from the top side of the cover in the manner of handles.

According to another feature of the invention it is provided that the swinging flaps, at least in their closed position, are in thermally conducting contact with the circuit carrier, that they consist of a material with a high thermal conductivity and that in their closed position they are provided with surfaces pointed outward with cooling fins or the like. In this manner the heat dissipation from heavy-duty power IC's in particular can further be improved considerably.

For circuit carriers with two parallel rows of contact feet (e.g. dual in line), it is provided that on the under side of the intermediate contact carrier two rows of contact plates respectively parallel to one another are arranged which rows are arranged side by side and run parallel to the rows of contact feet, which plates have openings on their contact ends projecting over the side edges of the intermediate contact carrier, openings for receiving the contact feet. Correspondingly two rows, arranged side by side, of contact elements which lie parallel to one another and opposite the respective assigned contact plates of the intermediate contact carrier are arranged on the base, which elements are composed respectively of a loop part arranged on the upper side of the base and a foot part bent downward over the side edges of the base and aligned in the plug-in direction. The foot parts are respectively received by the receptacles of the electrical appliance, while the loop parts make the connection with the contact plates of the intermediate contact carrier, which in turn are connected with the contact feet of the circuit carrier.

Fins are formed on the intermediate contact carrier respectively between the contact plates and on the base respectively between the loop parts, which fins form complementary profiles which grip in one another in a form-locking manner. These profiles ensure that the intermediate contact carrier and the base are aligned in the correct position relative to one another even before the contact plates make contact with the contact elements, so that no faulty plugging-in is possible.

The loop part of the contact elements of the base is approximately Z-shaped formed with a lower bottom arm lying on the upper side of the base as well as an upper arm contact arm over the connecting arm and joined flexibly with this. In this way the loop part, in the assembled state of the apparatus, is always flexibly pressed against its assigned contact plate, thereby assuring a reliable contact. The free end of the bottom arm points toward the side edge of the base and changes into the foot part, pointing in the plug-in direction, of the contact element, as will be described more accurately below.

The individual parts of the apparatus which can be assembled, particularly the intermediate contact carrier and the base, may be profiled (or shaped-transl.) in a manner permitting only one certain mutual assembly position. In a preferred development of the invention, however, it is provided that the base as well as the intermediate contact carrier respectively show a shape permitting a plurality of mutual assembly positions, for example rotated by 180°, and that coding lugs respectively blocking certain assembly positions can be fastened onto them. When it is not important to have a certain assembly position, the coding lugs can be omitted.

For fabricating a base according to the present invention with two rows of contact elements arranged side by side a process is proposed by which the contact elements of one row which are fastened by their foot parts on a common holding crosspiece are respective jointly pushed onto cut apart from the holding crosspiece. For fabricating the intermediate contact carrier corresponding to this base, a process is proposed according to which the contact plates of both rows, which plates are fastened by their contact ends to a common holding crosspiece and are joined together with their ends turned away from the contact ends, are pressed in common onto the under side of the intermediate contact carrier and the contact plates of the two rows are cut apart from one another and from the holding crosspieces. These processes can be carried out very well by automatic assembling units.

For the assembly of the circuit carrier on the intermediate contact carrier it is provided that the circuit carrier is put in place on the intermediate contact carrier with its contact feet being inserted in the assigned openings in the contact plates, and that the junctions between contact feet and contact plates are then made by a soldering bath.

Further advantages and features of the invention are found in the patent claims, the drawings and the description of the drawings. An embodiment example of the invention for an IC carrier is represented in the drawings and described in detail in the following.

BRIEF DESCRIPTION OF THE INVENTION

FIG. 4 shows a number of contact elements joined together by a connecting crosspiece for a base according to FIG. 1D.

FIG. 5 shows a number of contact plates joined together by connecting crosspieces for an intermediate contact carrier according to FIG. 1C.

FIG. 6 shows a cross section through an intermediate contact carrier with an IC carrier put in place according to FIGS. 1C and 1B during a soldering process.

BEST MODE FOR CARRYING OUT THE INVENTION

Figure 1:
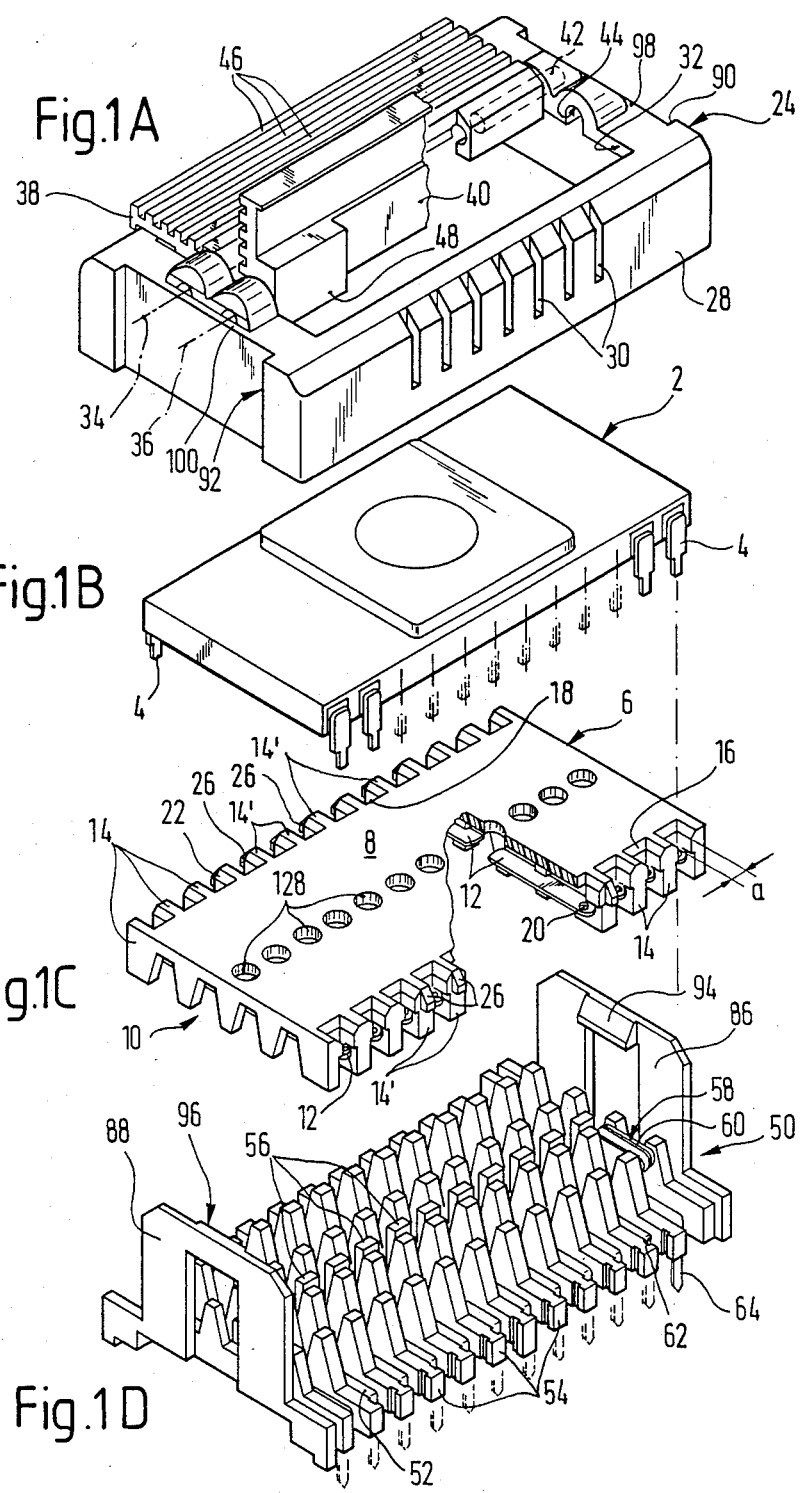
FIGS. 1A to 1D shows a cover, an IC carrier, an intermediate contact carrier and also a base in a perspective representation before their assembly.

FIG. 1 shows the individual components of the apparatus before they are assembled, namely, FIG. 1A represents the cover, FIG. 1B the IC carrier, FIG. 1C the intermediate contact carrier and FIG. 1D the base. The IC carrier 2 is of the dual-in-line type, i.e. it has two rows of contact feet 4 which are connected with the outputs of the IC component, which is not represented in detail. The IC carrier 2 is of the usual construction and therefore need not be described further.

FIG. 1C shows an intermediate contact carrier 6, which consists of an approximately plate-like basic part 8 made of an insulating material, for example plastic, which on its under side 10 is equipped for receiving a plurality of contact plates 12. As FIG. 1C shows, two rows, arranged side by side, of contact plates 12 parallel to one another are provided, so that each content foot 4 of the IC carrier 2 has assigned to it one contact plate 12 each of the intermediate contact carrier 6. The contact plates 12 each lie between fins 14 formed on the under side of the intermediate contact carrier 6, which fins run transversely to its lengthwise extension and insulate the individual contact plates electrically from one another. The contact plates 12 point with their ends projecting out beyond the side edges 16,18 of the intermediate contact carrier (6) respectively to openings 20 which serve for receiving the contact feet 4 of the IC carrier 2. The contact plates are retained on the intermediate contact carrier 6 by barb-like shapes formed on the plates, which embed themselves in the material of the intermediate contact carrier 6, as will be explained in detail below. Each of the fins 14 is shaped somewhat like a sawtooth, as is seen particularly from the first, end-side fin in FIG. 1C. This shaping serves for centering the intermediate carrier 6 on the base in a correct position.

In a first assembling step the IC carrier 2 is placed on the intermediate contact carrier 6, whereby each contact foot 4 engages in the opening 20 of the assigned contact plate 12. To facilitate the insertion of the contact feet 4 in the intermediate spaces remaining between the fins 14, the fins 14 respectively show bevelings 22 on their top side. The width a of the intermediate space receiving the contact feet 4 is dimensioned so that the contact feet 4 are retained between the fins with an easy force fit, so that no further fastening of the IC carrier 2 on the intermediate contact carrier 6 is necessary. After assembling, the junctions between the contact feet 4 and the contact plates 12 are soldered, as will be described further below.

The IC carrier 2 joined with the intermediate contact carrier 6 is inserted from below in the cover 24, which likewise consists of plastic. Thereby a plurality of holding catches 26 formed on the central fins 14' engage in the slots 30 formed on the side walls 28 of the cover 24. When the intermediate contact carrier 6 is inserted in the cover 24, the side walls 28 may first yield elastically until the holding catches 26 catch in the slots 30 and prevent the intermediate contact carrier 6 from sliding out of the cover. The slots 30 at the same time serve for feeding cooling air into the interior of the cover 24. A cooling air opening 32 is formed on the top side of the cover 24. Arranged in this opening are two swinging flaps 38,40 pivotable around their axes 34 and 36 respectively. Hinge pins 42 fastened onto these swinging flaps serve for the support of the latter and engage in hinge pin mountings 44 in the cover 24, as has been represented only once each for purposes of better visibility. The swinging flaps may respectively be swung between an open position (see swinging flap 40) and a closed position (see swinging flap 38). In their closed position they largely cover the cooling opening 32 so that the IC carrier 2 located below this is protected against contact and damage. There is still a gap left open between the swinging flaps 38,40 which permits the escape of cooling air coming through the slots 30. The swinging flaps 38,40 are preferably fabricated of a material with good thermal conductivity, e.g. aluminum, and are provided with cooling fins 46 on their surface which is pointed outward in their closed position. On the under side of the swinging flaps 38,40 are respectively arranged contact faces 48 which lie on the surface of the IC carrier 2 when the swinging flaps are closed and in this manner can dissipate the heat formed in the IC carrier 2. When both swinging flaps assume their open position, they lie with their top sides flat on one another and both then form a handle on which the whole submodule consisting of the IC carrier 2, the intermediate contact carrier 6 and the cover 24 can be grasped and handled.

The base 50 represented in FIG. 1D likewise consists of an electrically insulating material, plastic for example. The base essentially includes a flat bottom part 52

(see also FIG. 2) on the upper side of which are also formed a number of fins 54 running transversely to the lengthwise extension of the base 50. The fins 54 likewise have a sawtooth-like shape, such that the profile of the fins 54 is complementary in form to the profile of the fins 14. When the intermediate contact carrier 6 is put in place on the base 50, the teeth of the fins 14 respectively grip between the teeth of the fins 54 as is especially evident in FIG. 2. In this manner the intermediate contact carrier 6 is centered exactly in a direction transverse to its longitudinal alignment. In the intermediate space remaining between the fins 54 there are guide posts 56 arranged respectively approximately in the region of the longitudinal plane of symmetry of the base 50. These posts respectively guide the central tooth of each fin 14 or 14' in the longitudinal direction of the base 50, so as to ensure that the shapes of the fins 14, 14' or 54 respectively lie in one another exactly. This necessarily ensures a satisfactory mounting, in its correct position, of the intermediate contact carrier 6 on the base 50. Two parallel rows of contact elements 58 parallel to one another are arranged between the fins 54, of which elements only one is represented in FIG. 1D for sake of better visibility. As is seen particularly from FIG. 2, each of these contact elements 58 consist of a loop part 60 arranged on the top side of the base 50 and of a foot part 64 bent downward over the side edges 62 of the base and aligned in the plug-in direction. The loop part 60 of the contact element 58 is formed in approximately a Z shape with a bottom arm 66 lying on the top side of the bottom part 52 as well as an upper contact arm 70 connected flexibly with this bottom arm by way of the connecting arm 68. As FIG. 4 in particular shows, the contact arm 70 shows two upward arched regions 72 and 74 located one behind the other in the direction of its lengthwise extension and is slotted in the direction of this lengthwise extension. Two approximately hemispherical burls 76 aligned outward are arranged respectively on the vertex of the arched regions 72, 74. As FIG. 2 reveals, the contact plates 12 of the intermediate contact carrier 6 lie on the contact arm 70 in the assembled state. In this way, correspondingly to the number of burls 76, there are four contact points each between each contact element 58 and its assigned contact plate 12.

Figure 2:
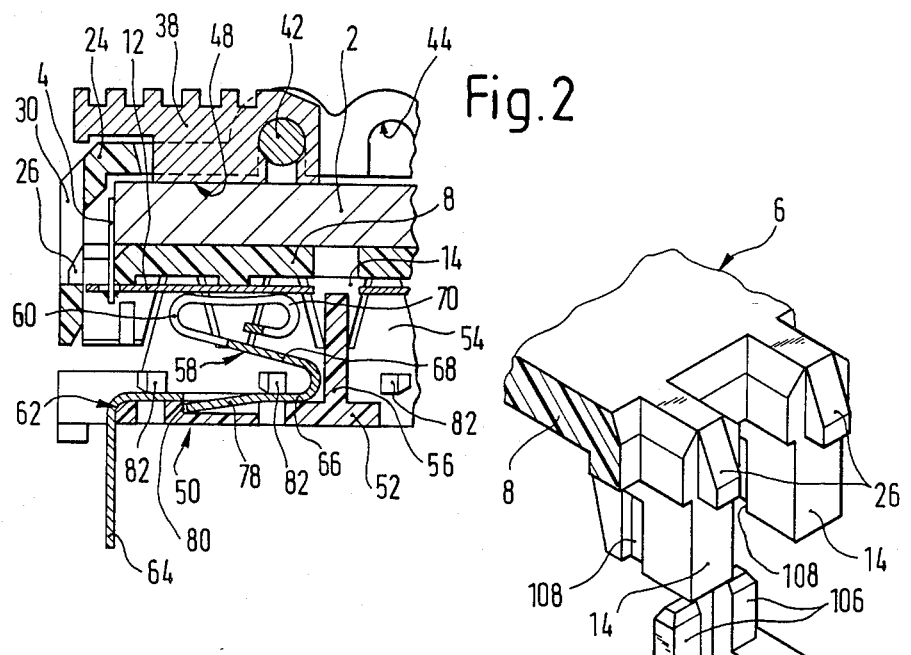
FIG. 2 shows a partial cross section through an assembled apparatus according to FIG. 1.
Figure 3:
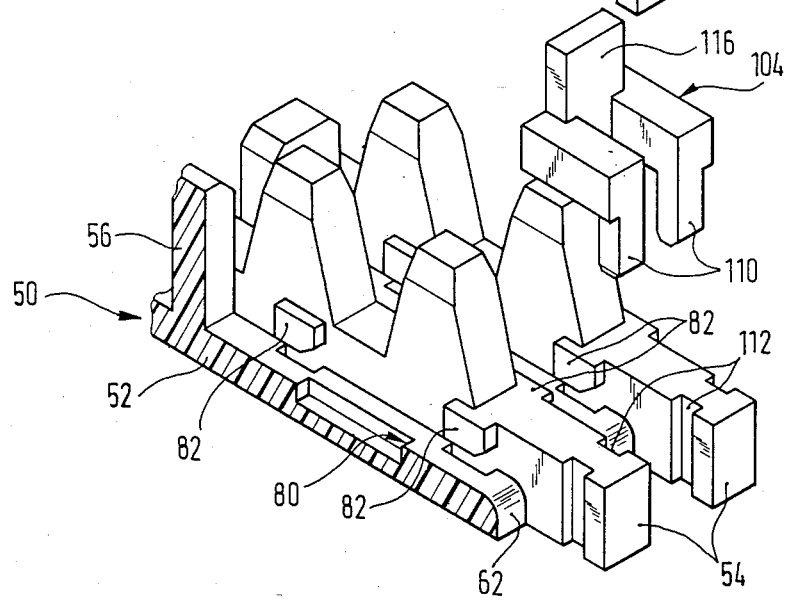
FIG. 3 shows a detail of the intermediate contact carrier as well as of the base according to FIGS. 1C and 1D in an enlarged representation.

As FIGS. 2 and 4 show, on the bottom arm 66 of the contact element 58 a spreading tongue 78 is formed which in the assembled state of the contact element 58 spreads out behind a holding face 80 formed in the bottom part 52 of the base 50. In this manner the contact element 58 is secured against being pushed out. Besides this, holding catches 82 respectively projecting out laterally are formed on the fins 54 of the base 50, which catches grip over the bottom arm 66 of the mounted contact element 58 and secure this against its being lifted up (FIGS. 2 and 3). As can be seen particularly in FIG. 4, the contact elements 58 are provided with a constriction 84 in the transition region from the bottom arm 66 to the connecting arm 68, which constriction allows the passage of this transition region between two holding catches 82 aligned opposite one another when the contact element is inserted under these holding catches.

On the two narrow sides of the base 50 are formed guide plates 86,88 pointed upward which engage in complementary guides 90,92 formed in the cover when the latter is put in place. The guide plates 86,88 are made flexible and are provided with catches 94,96 which when the cover 24 is placed on the base 50 grip behind holding faces 98,100 formed on the cover.

The assembling of the apparatus is done as follows: first the IC carrier 2 is placed on the intermediate contact carrier 6, whereby the contact feet 4 engage in the openings 20 in the contact plates 12. This subassembly group is then dipped in a soldering bath according to FIG. 6 in such a way that the junction between the contact feet 4 and the contact plates 12 is soldered. Any contact feet 4 projecting over the under side of the intermediate contact carrier 6 can then be cut apart. Then the sub-assembly group consisting of the IC carrier 2 and intermediate contact carrier 6 can be inserted in the cover 24, where they are held fast by the interaction of the holding catches 26 and the holding faces formed by the slots 30. The submodule formed in this manner is placed on the base, wherewith by the interaction of the guide plates 86,88 with the guides 90,92 a first mutual alignment is achieved. Before the contact plates 12 come in contact with the contact elements 58 of the base 50, the fins 14, 14' and 54 of complementary shape grip in one another, thereby ensuring an exact alignment of the submodule to the base 50. The contact arms 70 held flexibly over the connecting arms 68 then lie with their burls 76 against the assigned contact plates 12 under initial stress, and in this way create a secure tangent contact.

In order to ensure that the submodule can be placed on the base 50 in only a certain position, coding lugs 102 or 104 can be fastened onto the contact carrier 6 as well as onto the base 50, which exclude any erroneous assembly position (FIG. 3). The coding lug 102 can be pushed into grooves 108 formed on the fins 14 or 14' by two holding feet 106 formed on the lug. At the same time the second coding lug 104 is inserted in grooves 112 formed on the fins 54 by its holding feet 110 in such a way that the two coding lugs 102,104 overlap one another exactly in the unallowable assembling position. The plates 114,116 formed on the coding lugs 102,104 respectively come to lie against the opposite coding lugs and prevent the intermediate contact carrier 6 from being put in place on the base 50. With the correct mutual position, that is, when no coding lugs overlap one another, the plate 114 can respectively engage in grooves 112 and the plate 116 in grooves 108, so that plugging in together is not hindered.

For fabricating the base 50 it is provided that all contact elements 58 of one series which are still joined together by way of holding crosspiece 118 are pushed at the same time and in one working step onto the top side of the basic part 52 and respectively pushed under the holding catches 82 until the spreading tongues 78 spread out behind the holding faces 80. The contact elements of the two rows can obviously be assembled in one coincident working step. The holding crosspiece 118 are then cut apart from the contact elements 58 (FIG. 4).

In the fabrication of the intermediate contact carrier 6, the contact plates 12 of the two series are pressed onto the under side of the intermediate contact carrier in one working step. On the one hand the contact plates are fastened by their contact ends to common holding crosspieces 120,122 and on the other hand they are joined together by their ends turned away from the contact ends, as FIG. 5 shows. There are sawtooth shapes 124 formed somewhat in the manner of barbs on each of the contact plates 12, which shapes are cut into the material of the intermediate contact carrier and hold the contact plates fast in their place. Then in a further working step the holding crosspieces 120,122 as well as the webs 126 located between the contact plates are cut apart, so that all of the contact plates are isolated from one another. In order to be able to cut the webs 126 apart, the bottom part 8 of the intermediate contact carrier 6 shows passage openings 128 for the cutting die (FIG. 1C).

As a departure from the embodiment example described above, the invention can also serve in general for the plug-in assembling of small circuit carriers of another kind, e.g. for circuit boards and other printed circuits or circuit components, since the construction described does not presuppose integrated circuits. The IC carrier shown in the figures would then be replaced for example by a plate with discrete circuit elements or a plurality of integrated circuits.

We claim:

1. An apparatus for the plug-in assembling of a circuit carrier, provided with contact feet, onto an electrical appliance provided with receptacles, the apparatus including:
    a base made of electrically insulating material and a first set of contact elements arranged for plugging into the receptacles of the appliance, the base being adapted to receive the circuit carrier so that the contact feet of the circuit carrier come into an electrically conducting connection with the first set of contact elements of the base;
    a cover including means for mounting the cover on the base and a recess for receiving the circuit carrier;
    first holding means on the cover for holding the circuit carrier in a fixed, predetermined position within the cover;
    an intermediate contact carrier including contact plates fixedly arranged on the intermediate contact carrier for receiving and making an electrical connection with the contact feet of the circuit carrier; and
    second holding means formed on the base for holding the intermediate contact carrier and the cover in a predetermined, fixed position with respect to the base.

2. The apparatus as claimed in claim 1 for use with circuit carriers with contact feet aligned in the plug-in direction, wherein the apparatus includes an intermediate contact carrier (6) having contact plates (12) situated on its under side (10) and projecting outward over its side edges (16, 18), so that, when the intermediate contact carrier is placed on the underside of the circuit carrier, the contact feet (4) of the circuit carrier (2) overlap the side edges (16,18) of the intermediate carrier and come into electrically conducting connection with the ends of the contact plates (12) and wherein the first set of contact elements run on the top side of the base so that when the contact plates (12) of the intermediate contact carrier (16) are placed on the base (50) the contact plates come into electrically conducting connection with the first set of contact elements (58).

3. The apparatus as claimed in claim 1 wherein the cover (24) of its top side includes a cooling opening having at least one swinging flap (38,40) which is swingable outward in the manner of a door leaf between a closed position and an open position unblocking the opening.

4. The apparatus as claimed in claim 3, wherein the cover includes two swinging flaps (38,40) pivoted on their adjacent side edges and arranged side by side so that in their open position lying flat on one another they project out from the top side of the cover in the manner of a handle.

5. The apparatus as claimed in claim 3 wherein the swinging flap (38,40), at least in its closed position, is in heat-conducting contact with the circuit carrier (2), said swinging flap consisting of a material with a high thermal conductivity, and provided with cooling fins (46) pointing outward.

6. The apparatus as claimed in claim 2 for use with circuit carriers with two parallel rows of contact feet
    wherein, on the under side (10) of the intermediate contact carrier (6), two rows of contact plates (12) parallel to one another are arranged adjacent and parallel to the rows of contact feet, the contact plates including openings (20) on their ends projecting over the side edges (16,18) of the intermediate contact carrier (6), and
    wherein, two rows of first contact elements (58) are arranged on the base, side by side and parallel to one another and respectively opposite the contact plates (12) of the intermediate contact carrier (6), each of the first contact elements being composed of a loop part (60) arranged on the top side of the base (50) and a foot part (64) bent downward over the side edges (62) of the base (50) and aligned in the plug-in direction (64).

7. The apparatus as claimed in claim 6,
    wherein the intermediate contact carrier (6) includes fins (14, 14'; 54) formed between the contact plates (12),
    wherein fins are formed on the base (50) respectively between the loop parts (60), and
    wherein the fins (14, 14'; 54) of the intermediate contact carrier and the fins the base (50) respectively form complementary profiles grasping one another in a form-locking manner.

8. The apparatus as claimed in claim 7 wherein the loop part (60) of the first contact elements (58) of the base (50) is formed approximately Z-shaped with a lower bottom are (66) lying on the top side of the base (50) and an upper contact arm (70) joined flexibly with the bottom arm by way of a connecting arm (68) so that the free end of the base arm (66) points toward the side edge (62) of the base (50) and turns into the foot part (64) of the contact element.

9. The apparatus as claimed in claim 8, wherein the contact arm (70) includes two curved regions (72,74) arched upward and situated one behind the other in the direction of its lengthwise extension and slotted in the direction of the lengthwise extension.

10. The apparatus as claimed in claim 9, wherein the contact arm (70) includes an outward-turned approximately hemispherical burl (76) approximately on the vertex of the curved regions (72,74).

11. The apparatus as claimed in claim 8
    wherein laterally projecting holding catches are formed on the fins (54) of the base (50) which grasp from above the bottom arm (66) of the first contact element (58), and
    wherein the first contact elements (58) in the transition region from the bottom arm (66) to the connecting arm (68) include a constriction (84) making possible the passing of the transition region between two holding catches (82) turned oppositely when the first contact element is inserted under these holding catches.

12. The apparatus as claimed in claim 8 including a holding face formed on the base, and wherein a spreading tongue (78) is formed on the bottom arm (66) of the first contact elements and is turned counter to any pushing-out motion of the latter so that the tongue spreads out behind the holding face (80) in the pushed-in position of the first contact element (58).

13. The apparatus as claimed in claim 7 wherein sawtooth profiles (124) are formed in the fins of the intermediate carrier adjacent the side edges of the contact plates (12) lying against the fins (14, 14') of the intermediate contact carrier (6).

14. The apparatus as claimed in claim 2 wherein the cover includes a plurality of holding surfaces formed in the side walls of the cover and wherein catches (26) are formed on two opposite outer sides of the intermediate contact carrier (6) so that when the intermediate carrier is inserted in the cover (24), the catches grip behind corresponding holding surfaces of the cover (24).

15. Apparatus as claimed in claim 1 wherein the individual parts of the apparatus which are assembled are shaped in a manner that permits only certain operational assembly positions.

16. Apparatus as claimed in claim 15, wherein the base (50) and the intermediate contact carrier (6) are shaped to permit a plurality of operational assembly positions and wherein said apparatus includes coding lugs (102,104) fastened onto the base and intermediate carrier which block erroneous assembly positions.

* * * * *